US009761595B2

(12) United States Patent
Rothleitner

(10) Patent No.: US 9,761,595 B2
(45) Date of Patent: Sep. 12, 2017

(54) ONE-TIME PROGRAMMING DEVICE AND A SEMICONDUCTOR DEVICE

(71) Applicant: Infineon Technologies AG, Neubiberg (DE)

(72) Inventor: Hubert Rothleitner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/772,409

(22) Filed: Feb. 21, 2013

(65) Prior Publication Data

US 2014/0231895 A1    Aug. 21, 2014

(51) Int. Cl.
| G11C 16/04 | (2006.01) |
| H01L 27/112 | (2006.01) |
| G11C 17/16 | (2006.01) |
| H01L 29/423 | (2006.01) |

(52) U.S. Cl.
CPC ........ H01L 27/11206 (2013.01); G11C 17/16 (2013.01); H01L 29/4238 (2013.01)

(58) Field of Classification Search
CPC ..... H01L 29/78; H01L 27/12; H01L 27/0928; H01L 27/11206; H01L 27/115; H01L 29/4238
USPC ........................................ 257/321, 325, 441
See application file for complete search history.

(56) References Cited

U.S. PATENT DOCUMENTS

| 3,634,929 A | 1/1972 | Yoshida et al. | |
| 5,387,812 A | 2/1995 | Forouhi et al. | |
| 5,451,799 A * | 9/1995 | Kurimoto | H01L 27/0266 257/174 |
| 6,229,733 B1 * | 5/2001 | Male | 365/185.18 |
| 6,515,344 B1 * | 2/2003 | Wollesen | 257/530 |
| 6,584,029 B2 * | 6/2003 | Tran et al. | 365/225.7 |
| 6,630,724 B1 * | 10/2003 | Marr | G11C 17/16 257/530 |
| 6,940,751 B2 * | 9/2005 | Peng et al. | 365/177 |
| 7,402,855 B2 * | 7/2008 | Kurjanowicz | 257/288 |
| 7,764,532 B2 * | 7/2010 | Kurjanowicz et al. | 365/96 |
| 7,805,687 B2 * | 9/2010 | Hu et al. | 716/117 |
| 7,834,417 B2 * | 11/2010 | Min et al. | 257/530 |

(Continued)

OTHER PUBLICATIONS

Wlodek Kurjanowicz; "Evaluating Embedded Non-Volatile Memory for 65nm and Beyond"; Sidense: The Future of Logic NVM; Sidense Corp. 2008, p. 1-23.

(Continued)

Primary Examiner — Cheung Lee
Assistant Examiner — Stephen C Smith
(74) Attorney, Agent, or Firm — Eschweiler & Potashnik, LLC

(57) ABSTRACT

A one-time programming device includes a field effect semiconductor transistor with a gate or a channel region of the field effect semiconductor transistor including a shape of a footprint so that in an on-state of the field effect semiconductor transistor a critical electrical field is reached within an area of the channel region, a bulk region or a drain region of the field effect semiconductor transistor due to the shape of the footprint resulting in a damage of a p-n junction between the channel region or the bulk region and the drain region of the field effect semiconductor transistor or resulting in a damage of a gate insulation of the field effect semiconductor transistor after a predetermined programming time.

16 Claims, 5 Drawing Sheets

(56) References Cited

U.S. PATENT DOCUMENTS

| | | | |
|---|---|---|---|
| 7,915,095 B2 | 3/2011 | Herner | |
| 8,026,574 B2 * | 9/2011 | Kurjanowicz et al. | 257/530 |
| 8,283,751 B2 * | 10/2012 | Kurjanowicz | 257/530 |
| 8,313,987 B2 * | 11/2012 | Kurjanowicz et al. | 438/131 |
| 8,373,167 B2 * | 2/2013 | Horch | 257/59 |
| 8,470,645 B2 * | 6/2013 | Candelier et al. | 438/131 |
| 8,599,612 B2 * | 12/2013 | Liu et al. | 365/185.03 |
| 2003/0030081 A1 * | 2/2003 | Arima | H01L 29/7831 257/288 |
| 2006/0244099 A1 | 11/2006 | Kurjanowicz | |
| 2007/0165441 A1 * | 7/2007 | Kurjanowicz | G11C 17/16 365/96 |
| 2008/0170457 A1 * | 7/2008 | Kothandaraman | 365/225.7 |
| 2008/0185627 A1 * | 8/2008 | Horch | 257/315 |
| 2008/0315268 A1 * | 12/2008 | Zhu | 257/288 |
| 2010/0032732 A1 * | 2/2010 | Booth et al. | 257/288 |
| 2012/0039107 A1 * | 2/2012 | Chung | 365/104 |
| 2012/0211841 A1 * | 8/2012 | Kurjanowicz | 257/369 |
| 2013/0270559 A1 * | 10/2013 | Hafez et al. | 257/50 |

OTHER PUBLICATIONS

"Programmable Read-Only Memory"; http://en.wikipedia.org/wiki/programmable_read-only_memory; Feb. 19, 2013, p. 1-3.
Vivien Lin; "Integrating High Density Antifuse OTP NVM for Code Storage"; www.kilopass.com; Jul. 2009, p. 1-7.

* cited by examiner

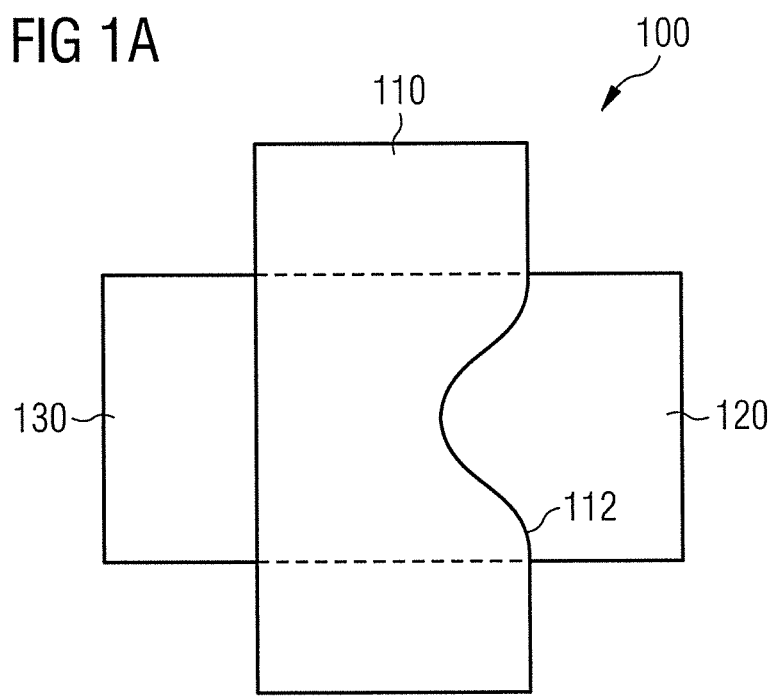
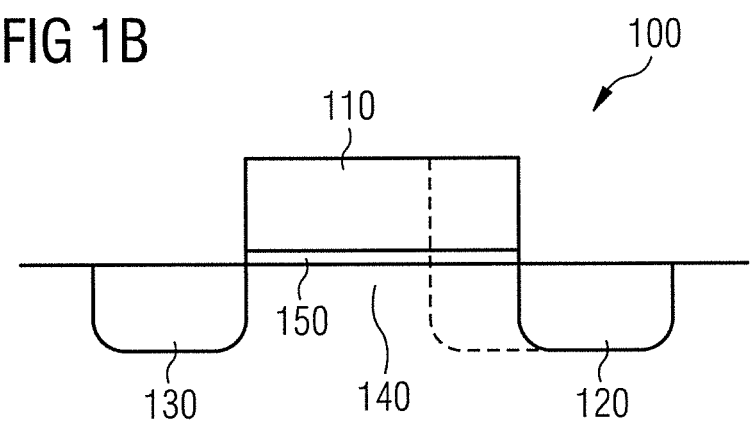

ONE-TIME PROGRAMMING DEVICE AND A SEMICONDUCTOR DEVICE

FIELD

Embodiments relate to the field of non-volatile memories and in particular to a one-time programming device and a semiconductor device comprising an array of one-time programming devices.

BACKGROUND

In many electronic applications, it is necessary to store digital information permanently, securely and highly reliably. This requirement results from user or customer-specific necessity, where a program code is given by firmware and is stored in an NVM (non-volatile memory), for example. Further, data is often required (e.g., chip identification, customer version, skimming data for analog value adjustment (e.g., reference voltages, reference currents, switching thresholds, switching temperatures)), which may be programmed after manufacturing one time. It may be desired that the data is possibly burned in during the test procedure of a device or an application circuit and which cannot be erased or overwritten anymore. Some non-volatile memories integrated on chips are based on the method of one-time programming.

Such methods for programming non-volatile data on a chip one time can be based on PROM (programmable read-only memory), EEPROM (electrically erasable programmable read-only memory), flash memory or one-time programming devices (OTP), for example. The different methods are based on several physical mechanisms. For example, some are based on fusing. In this case, a lower resistive device structure is made open or highly resistive by an overcurrent impulse (e.g. poly fuse (open) metal fuse (open)). Another mechanism is based on laser fusing, which opens a low resistive connection by a laser cut. Further, also anti-fusing is one of these mechanisms. Here, a high resistive device structure is shortcut or made low resistive by an overvoltage or an overcurrent (e.g. oxide break (short), diode zapping (short)). Further, a one-time programming device may be based on an EEPROM or flash memory. In this case, the conductivity of an MOS-transistor (metal oxide semiconductor transistor) is defined by a deposited floating gate charge.

SUMMARY

A one-time programming device according to an embodiment comprises a field effect semiconductor transistor. A gate or a channel region of the field effect semiconductor transistor comprises the shape of a footprint so that in an on-state of the field effect semiconductor transistor a critical electrical field is reached within an area of the channel region, a bulk region or a drain region of the field effect semiconductor transistor due to the shape of the footprint resulting in a damage of a p-n junction between the channel region or the bulk region and the drain region of the field effect semiconductor transistor or resulting in a damage of a gate insulation of the field effect semiconductor transistor after a predefined programming time.

Embodiments may be based on the finding that the shape of the footprint of the gate and/or the channel region of a field effect semiconductor transistor can be constructed so that a critical electrical field can be reached within the channel region, the bulk region or the drain region. Consequently, the field effect semiconductor transistor can be programmed by damaging the gate insulation or the p-n junction between the channel region or the bulk region and the drain region by using commonly available voltages without the necessity of generating higher voltages (e.g., by a charge pump). Further, additional steps for manufacturing the one-time programming device can be avoided, since the shape of the footprint of the gate can be defined by the mask used for shaping also other gates of structures on a die and the shape of the footprint of the channel region can be defined by the shape of the gate and the mask used for manufacturing the shallow trench isolation (STI) or field oxide (FOX) between the different structures on a die. Therefore, the one-time programming device can be manufactured with low place requirement and almost no or no additional manufacturing effort.

In some embodiments, the shape of the footprint of the gate comprises a notch at an edge of the gate facing the drain resulting in a channel length of the field effect semiconductor transistor varying over a channel width of the field effect semiconductor transistor so that the critical electrical field is reached within an area of the channel region, the bulk region or the drain region close to an area of the notch constituting a minimal channel length. Independent from the exact shape of the notch, the channel length is varied over the channel width so that charge carriers tend to take the shortest way from source to drain resulting in an increased electrical field in the area of the notch closest to the source region. In this way, the critical electrical field can be reached due to the shape of the footprint of the gate and a one-time programming device can be manufactured with low effort.

Also some embodiments relate to a one-time programming device with the shape of the footprint of the channel region of the field effect semiconductor transistor comprising a varying width, resulting in a varying channel width. In this connection, the width of the channel region at an edge of the gate facing the source region can be implemented larger than a width of the area of the channel region, the bulk region or the drain region reaching the critical electrical field. By narrowing the channel width, less space is available for charge carriers moving from source to drain so that the electrical field is increased during moving to a narrower part of the channel region. In this way, a one-time programming device can be manufactured with low effort as well.

Some embodiments relate to a one-time programming device with a field effect semiconductor transistor comprising a bulk connection constructed so that in the on-state of the field effect semiconductor transistor a parasitic bipolar transistor established between the source region, the drain region and the bulk contact contributes with at least 10% to the overall drain current before the gate insulation or the p-n junction between the channel region or the bulk region and the drain region is damaged.

Due to the additional bipolar transistor current, the time necessary to damage the gate insulation or the p-n junction can be significantly reduced resulting in a low necessary programming time (e.g., by increasing a bulk contact resistance by leaving out the lightly-doped drain implant or the halo implant).

Some embodiments relate to a one-time programming device comprising a field effect semiconductor transistor. The field effect semiconductor transistor is constructed so that in an on-state of the field effect semiconductor transistor a critical electrical field is reached within an area of a channel region, a bulk region or a drain region of the field effect semiconductor transistor resulting in a damage of a p-n junction between the channel region and the drain region of the field effect semiconductor transistor after a predefined programming time. The MOS transistor structure provides the possibility of manufacturing a one-time programming device which is programmed by destroying or damaging the p-n junction between the channel region or the bulk region and the drain region of the transistor. In this way, a one-time programming device based on this physical mechanism can be manufactured with low effort.

BRIEF DESCRIPTION OF THE DRAWINGS

Some embodiments of apparatuses and/or methods will be described in the following by way of example only, and with reference to the accompanying figures, in which FIG. 1A shows a schematic top view of a one-time programming device;

FIG. 1B shows a schematic cross-section of a one-time programming device;

DETAILED DESCRIPTION

Figure 2:
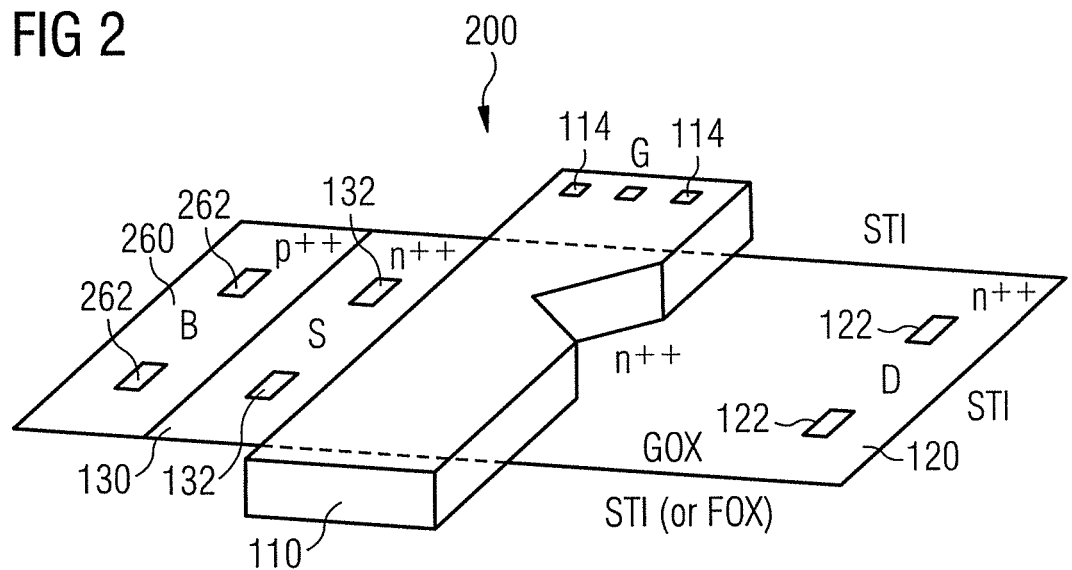
FIG. 2 shows a schematic three-dimensional illustration of a one-time programming device.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIGS. 1A and 1B show a schematic top view and cross-section of a one-time programming device 100 according to an embodiment. The one-time programming device 100 comprises a field effect semiconductor transistor. This field effect semiconductor transistor comprises a gate 110 or a channel region 140 with a shape 112 of a footprint so that in an on-state of the field effect semiconductor transistor a critical electrical field is reached within an area of the channel region 140, within a bulk region or within a drain region 120 of the field effect semiconductor transistor due to the shape 112 of the footprint resulting in damage of a p-n junction between the channel region 140 and the drain region 120 or between the bulk region 140 and the drain region 120 of the field effect semiconductor transistor or resulting in a damage of a gate insulation 150 of the field effect semiconductor transistor after a predefined programming time.

Due to the specific design of the shape of the footprint of the gate 110 or the channel region 140, the field within the channel region 140, the bulk region or the drain region 120 can be increased at least to a critical electrical field so that a damage of the gate insulation or the p-n junction between the channel region 140 or the bulk region and the drain region 120 can be caused. This irreversible damage results in an increased leakage current of the drain region, also in an off-state of the field effect semiconductor transistor, which can be sensed to determine the state (programmed or not programmed) of the one-time programming device. The one-time programming device can be manufactured without additional manufacturing steps or the necessity of modifying an existing manufacturing step compared to other MOS structures, since the shape of the gate or the channel region can be changed by adapting a corresponding mask for the manufacturing of the gate or the channel region. Therefore, the one-time programming device can be manufactured with low or no additional effort or costs.

A one-time programming device 100 is a memory unit storing non-volatile data (e.g., one bit per device), for example. According to the described concept, the proposed one-time programming device 100 can be programmed one time irreversibly.

The one-time programming device can be implemented independently of the semiconductor technology used (e.g., from large 1 μm technology down to 32 nm technology and below).

Further, the one-time programming device can also be implemented on an arbitrary semiconductor substrate. For example, the one-time programming device 100 can be implemented on a silicon substrate (e.g., with p or n doping), an epitaxial layer on a silicon or silicon carbide substrate (e.g., with n or p doping) or a silicon on insulator substrate.

Independent from the semiconductor technology and/or semiconductor substrate used, a field effect semiconductor transistor comprises the same basic elements, for example. These can be a source region 130 comprising a first conductivity type (n or p, using a corresponding dopant type), a drain region 120 comprising the same first conductivity type (n or p), a channel region 140 arranged between the source region 130 and the drain region 120 and a bulk region comprising a second conductivity type, opposite to the first conductivity type (p or n) and a gate 110 arranged on top of the channel region 140. The bulk region is arranged so that a p-n junction is formed between the bulk region and the source region 130 as well as between the bulk region and the drain region 120. The gate 110 is electrically insulated from the channel region 140 by a gate insulation 150 between the gate 110 and the channel region 140. The channel region 140 is a part of the bulk region joining or facing the gate insulation and establishing a conductive channel in an on-state of the field effect semiconductor transistor. In other words, the channel region 140 may be the part of the bulk in which a channel is formed or built up in an on-state of the transistor.

Further, the field effect semiconductor transistor may be a metal oxide semiconductor transistor or another field effect transistor using a conductive material electrically insulated by a gate insulation layer from the semiconductor.

The gate insulation or gate insulation layer 150 may be a gate oxide (e.g., comprising or consisting of silicon oxide) or a high-k material layer (e.g., comprising or consisting of hafnium oxide). The gate insulation between the gate 110 and the channel region 140 may comprise a constant thickness (neglecting manufacturing tolerances) so that a standard gate insulation manufacturing process (which may also be used for other transistors on the same die) can be used.

Based on an often used manufacturing process, this configuration can be automatically obtained, since the heavily doped source and drain implementation is masked by the gate 110 so that the channel region 140 is automatically located between the source region 130 and the drain region 120 and below the gate 110, for example.

In this way, the shape of the footprint of the gate 110 also influences the shape of the footprint of the channel region 140 in the direction of the neighboring source region 130 and drain region 120. However, especially the channel width (the borders not neighboring the source region 130 or the drain region 120) may be not determined by the shape of the footprint of the gate 110. The channel region 140 is, in one embodiment, bordered by the shallow trench isolation (STI) or a field oxide (FOX) at the remaining sides (which are not joining the drain or source region). In this connection, the shape of the footprint of the gate 110 means the geometric form of the area or surface of the gate 110 being in contact with the gate oxide 150. Correspondingly, the shape of the footprint of the channel region 140 means the geometric form of the area or surface of the channel region 140 being in contact with the gate oxide 150. As described, the shape 112 of the footprint of the gate 110 may automatically influence the shape of the footprint of the channel region 140 at least partly (at the borders joining the source or drain region). However, the shape of the remaining borders of the channel region 140 may also influence the strength of the electrical field within the channel region 140.

The gate 110 or the channel region 140 are shaped so that in an on-state of the field effect semiconductor transistor a critical electrical field is reached. The on-state of the field effect semiconductor transistor means a state in which voltages or electrical potentials are provided to the source, drain, gate and/or bulk of the transistor bringing the transistor in a conductive state (e.g., a conductive channel is built up in the channel region). In a digital circuit, this means that the gate voltage $V_{gs}$ is high and the drain voltage $V_{ds}$ is also high, for example. Depending on the semiconductor technology used for manufacturing the one-time programming device 100, these voltages may vary (e.g., $V_{gs}=V_{vdd}=V_{vcc}$ may be 5 V, 3.3 V, 2.5 V or 1.5 V). In other words, in the on-state of the field effect semiconductor transistor a technology-dependent typical electrical voltage is supplied to source, drain, gate and bulk of the transistor. For example, at the most a maximal voltage difference (as mentioned e.g., 5 V, 3.3 V, 2.5 V or 1.5 V) available or used for operating a standard field effect semiconductor providing a stable transistor functionality (e.g., manufactured on the same semiconductor die) is used as gate/source voltage $V_{gs}$ and drain/source voltage $V_{ds}$ for the field effect semiconductor transistor of the one-time programming device 100 reach in the on-state.

The critical electrical field is an electrical field with a strength that causes damages at the field effect semiconductor transistor at least if it is supplied to the transistor for a longer time than some time threshold (e.g., most field effect semiconductor transistors may resist such a critical electrical field only for a short time). The critical electrical field may depend on the substrate or bulk material on which the transistor is manufactured and/or on the dopant density and dopant distribution within the substrate or bulk material, for example.

For example, the critical field to be reached is larger than 25 V/μm (or more than 30 V/μm) for silicon, for example.

Since damage is desired to program the one-time program device 100, the predefined programming time may be chosen or set so that the critical electrical field is reached for a sufficient time to cause damage to the field effect semiconductor transistor definitely or most likely.

For example, the predefined programming time is chosen or fixed at less than 10 s (or less than 1 s, less than 10 ms or less than 1 ms).

The critical electrical field is reached within the area of the channel region 140, the bulk region or the drain region 120 due to the shape of the footprint of the gate 110 and/or the channel region 140. This means that the shape of the footprint of the gate and/or the channel region 140 influences the electrical field within the channel region 140 in a way that at least at one point or in an area of the channel region 140, the bulk region or the drain region 120 (not the whole channel region, bulk region or drain region) the critical electrical field is reached. Depending on the technology used for manufacturing and/or the doping distribution, the critical electrical field is reached in the channel region 140, the bulk region or the bulk region 120 or in two or all of them. In many cases, the critical electrical field may be reached at the border between the channel region 140 and the drain region 120 or the bulk region and the drain region 120. In other words, the shape 112 of the footprint of the gate 110 and/or the channel region 140 is designed or configured to cause an inhomogeneous electrical field within the channel region 140 so that the critical electrical field is reached in a subarea of the channel region 140, the bulk region or the drain region 120 in an on-state of the transistor. However, further additional or optional effects or structural features of the transistor may promote the formation of the critical electrical field.

The critical electrical field causes a damage of the p-n junction between the channel region or the bulk region and the drain region (e.g., depending on the used semiconductor technology or the dopant distribution) of the transistor or a damage of the gate oxide of the transistor after the predefined programming time. Damage of the p-n junction means that an increased off-state current or leakage current occurs in the off-state of the transistor between the channel region or the bulk region and the drain region. Similarly, a damage of the gate oxide means that an increased off-state current or leakage current occurs between the drain region 120 and the gate 110. For a reliable determination of this increased off-state current or leakage current, the off-state current or leakage current may be at least 10× (or at least 100× or at least 1000×) higher after programming the one-time programming device 100 than before. In other words, the field effect semiconductor transistor may be constructed so that an off-state drain current is at least 100× higher after being in the on-state for at least a predefined programming time than before, for example. The field effect semiconductor transistor is in the off-state when an electrical potential is applied to the gate 110 so that the transistor is in a non-conductive state (e.g., $V_{gs}=0$, $V_{ds}=V_{dd}$ or digitally high). In other words, the electrical potential applied to the gate 110 cuts off the current between source 130 and drain 120 (neglecting a remaining blocking current).

The shape of the footprint of the gate 110 and/or the channel region 140 can be formed in various ways or may comprise various geometrical shapes in order to promote the formation of the critical electrical field within the area of the channel region 140, the bulk region or the drain region 120. For example, the shape of the footprint of the gate 110 and/or the channel region 140 may comprise one or more restrictions or neckings along the channel width of the channel region 140 resulting in a varying channel length between the source region 130 and a drain region 120 of the field effect semiconductor transistor, for example. Such a necking or restriction may be located at the edge of the gate 110 facing the drain region 120 or at the edge of the gate 100 facing the source region 130. Such a restriction or necking may be implemented by a notch. Such a notch may be located at the drain edge and/or the source edge of the gate 110. It may be sufficient to implement such a notch at the edge of the gate 110 facing the drain region 120, since the p-n junction or the gate oxide may be more easily damaged if the critical electrical field is reached close to the drain region 120. An example for a gate 110 with the shape of the footprint comprising such a notch at the edge of the gate facing the drain region 120 is already shown in FIG. 1A. In this example, the channel region 140 does not comprise an additional restriction or necking varying the channel width, which may be also possible. In other words, optionally the shape 112 of the footprint of the gate 110 comprises a notch at an edge of the gate 110 facing the drain region 120 resulting in a channel length of the field effect semiconductor transistor varying over a channel width of the field effect semiconductor transistor so that the critical electrical field is reached within an area of the channel region 140, the bulk region or the drain region 120 close to an area of the notch constituting a minimal channel length. Further, the critical electrical field may be reached closer to the drain region 120 than to the source region 130. The notch may be shaped in various ways. For example, the notch may comprise a wedge-shaped shape, a triangular shape, a rectangular shape, a square shape, an acerous shape, a polygonal shape, a semicircular shape or a rounded shape (e.g., FIG. 1A).

FIG. 2 shows an example for a one-time programming device 200 comprising a field effect semiconductor transistor with a gate 110 with a wedge-shaped shape or triangular shape of the footprint. In this example, contact areas for the gate 114, for the drain 122 and for the source 132 as well as a bulk contact region 260 with bulk contact areas 262 are indicated. The drain region 120, the source region 130, the bulk contact region 260 as well as the channel region below the gate 110 is surrounded by a shallow trench isolation (STI) or a field oxide (FOX). A gate oxide (GOX) may cover the drain region 120, the source region 130 and the bulk contact region 260 with the exception of the contact areas, although it may be sufficient to implement the gate oxide between the channel region 140 and the gate 110. In this example, an n-MOS transistor is shown. In this case, the drain region 120 and the source region 130 may comprise a heavy n-doping (n++) and the bulk contact region 260 may comprise a heavy p-doping (p++). Similarly, also a p-MOS transistor may be implemented.

In this example, the footprint of the gate located above the channel region comprises basically a rectangular shape with the notch at the edge of the gate 110 facing the drain region 120. Depending on the length and the width of the channel, the shape may also be basically quadratic with the notch at the edge of the gate 110 facing the drain region 120. However, the footprint of the gate 110 may also comprise other geometrical shapes with a notch at the edge of the gate 110 facing the drain region 120 (or also additionally or alternatively with a notch at the end of the gate facing the source region).

A one-time programming device 100, 200 according to the described concept may be manufactured with an arbitrary width. However, the one-time programming device can be manufactured in a very space-saving manner. In FIG. 2, a one-time programming device 200 with two neighboring contact areas for source 122, drain 132 and bulk 262 are illustrated. Alternatively, the width of the one-time programming device can be further reduced so that source, drain and bulk are connected through only one contact area each.

Figure 3:
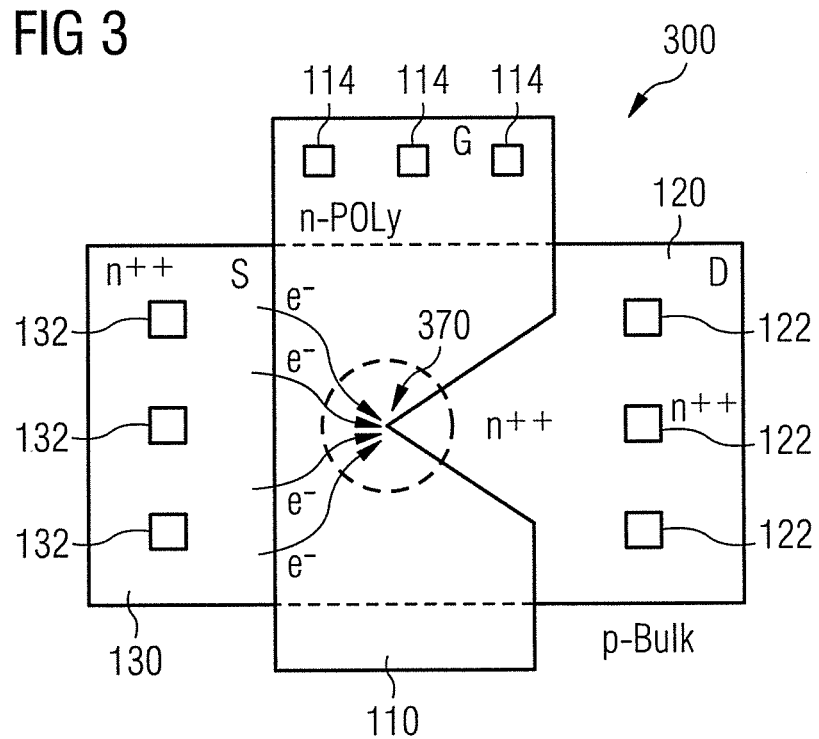
FIG. 3 shows a schematic top view of a one-time programming device.

Alternatively, a one-time programming device with larger width and more contact areas can be manufactured. In this case, the reliability of contacting of source, drain and bulk can be increased. Further, the critical electrical field may be reached faster and/or more easily because source and/or drain may be able to provide more charge carriers. FIG. 3 shows an example of a one-time programming device 300 with three contact areas for source 130 and drain 120. The other structural features are similar to the one-time programming device shown in FIG. 2 as well as the concept described in FIGS. 1A and 1B. However, in this example, the bulk contact region 260 may be far away from the source region 130 and the drain region 120, so that the bulk resistance is increased as it will be explained later on. The one-time programming device 300 is manufactured on a p-bulk and the gate 110 comprises n-polysilicon, for example.

Further, the area 370 of the channel region, the bulk region or the drain region reaching the critical electrical field is indicated by a dashed circle. Further, some example paths of movement of electrons from the source region 130 to the area 370 of the channel region, the bulk region or the drain region reaching the critical electrical field are indicated. As it is shown, the critical electrical field may be reached close to or around the area of the notch constituting a minimal channel length, since this is the shortest way for the electrons through the channel region to the drain region 120. In the example of FIG. 3, the minimal channel length is formed by the tip of the notch.

Optionally, additionally or alternatively, the shape of the footprint of the channel region 140 may comprise a varying width. For example, the channel region 140 may reduce its width from the source region 130 to the area of the channel region 140 reaching the critical electrical field.

Figure 4:
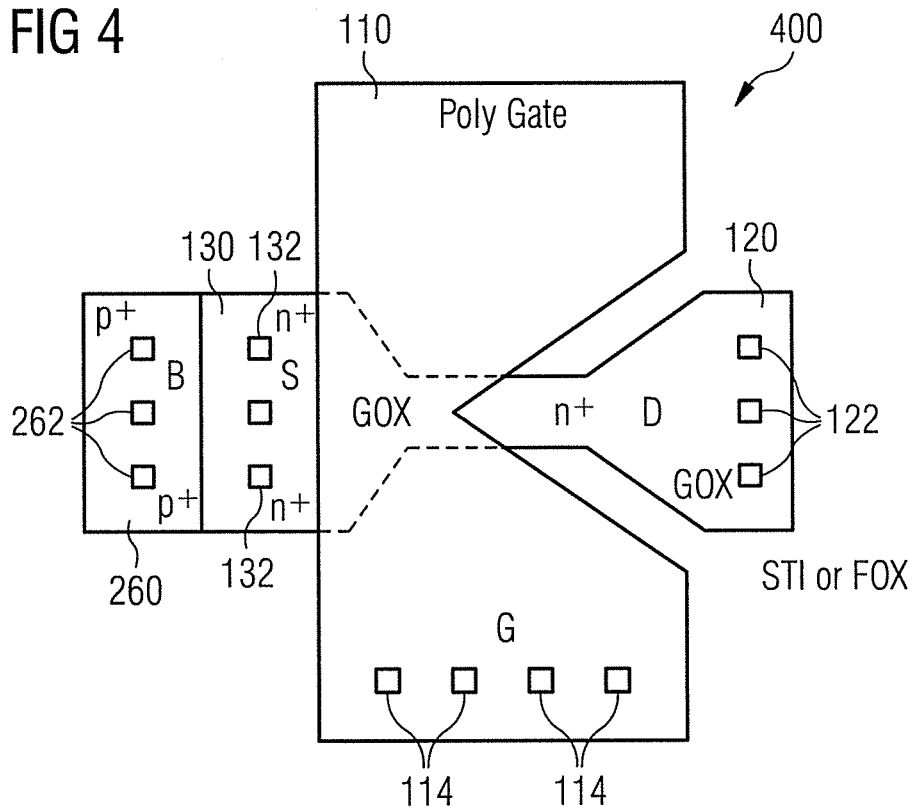
FIG. 4 shows a schematic top view of another one-time programming device.

In other words, the shape of the footprint of the channel region 140 may comprise a varying width resulting in a varying channel width so that the width of the channel region at an edge of the gate 110 facing the source region 130 is larger than a width of the area of the channel region 140, the bulk region or the drain region 120 reaching the critical electrical field. In this way, charge carriers can be provided from a broad source region, however all these charge carriers have to pass the narrow part of the channel region 140 increasing the electrical field at the narrow region. The drain region 120 may be as narrow as the channel region 140 at the area of the critical electrical field. Alternatively, the drain region 120 may expand in the direction to the contact regions 122 of the drain 120 as it is shown in FIG. 4, for example. The one-time programming device 400 in FIG. 4 shows a combination of a gate 110 with the shape of a footprint comprising a notch as well as a channel region with a decreasing width from the source region 120 to the area reaching the critical electrical field. The channel region can be narrowed by using a large variety of different shapes. For example, the width of the channel region may comprise a funnel-shaped taper from the edge of the gate 110 facing the source region 130 to the area of the channel region reaching the critical electrical field as it is shown in FIG. 4. Optionally or additionally, the drain region 120 may expand its width in the direction of the contact areas 122 of the drain region 120 as already mentioned. In this way, more contact regions 122 can be manufactured for the drain 120 so that a reliable contact can be achieved. Such a structure (active area starting from the source narrowing its width in the channel region and expanding it in the drain region) may be called curare structure. Further structural aspects of the one-time programming device 400 shown in FIG. 4 are similar to corresponding features of the example shown in FIGS. 2 and 3 and the concept described in FIGS. 1A and 1B.

Optionally or additionally, the formation of the critical electrical field can be further promoted by provoking or activating an additional current through a parasitic bipolar transistor established between the source region 120, the drain region 120 and the bulk contact of the field effect semiconductor transistor of the one-time programming device. Such an additional occurrence of this parasitic bipolar transistor is undesired for usual standard field effect semiconductor transistors (designed to provide a stable transistor functionality) and often a lot of effort is made to inhibit this bipolar effect. However, for the one-time programming device this bipolar effect may have a positive influence.

Figure 6:
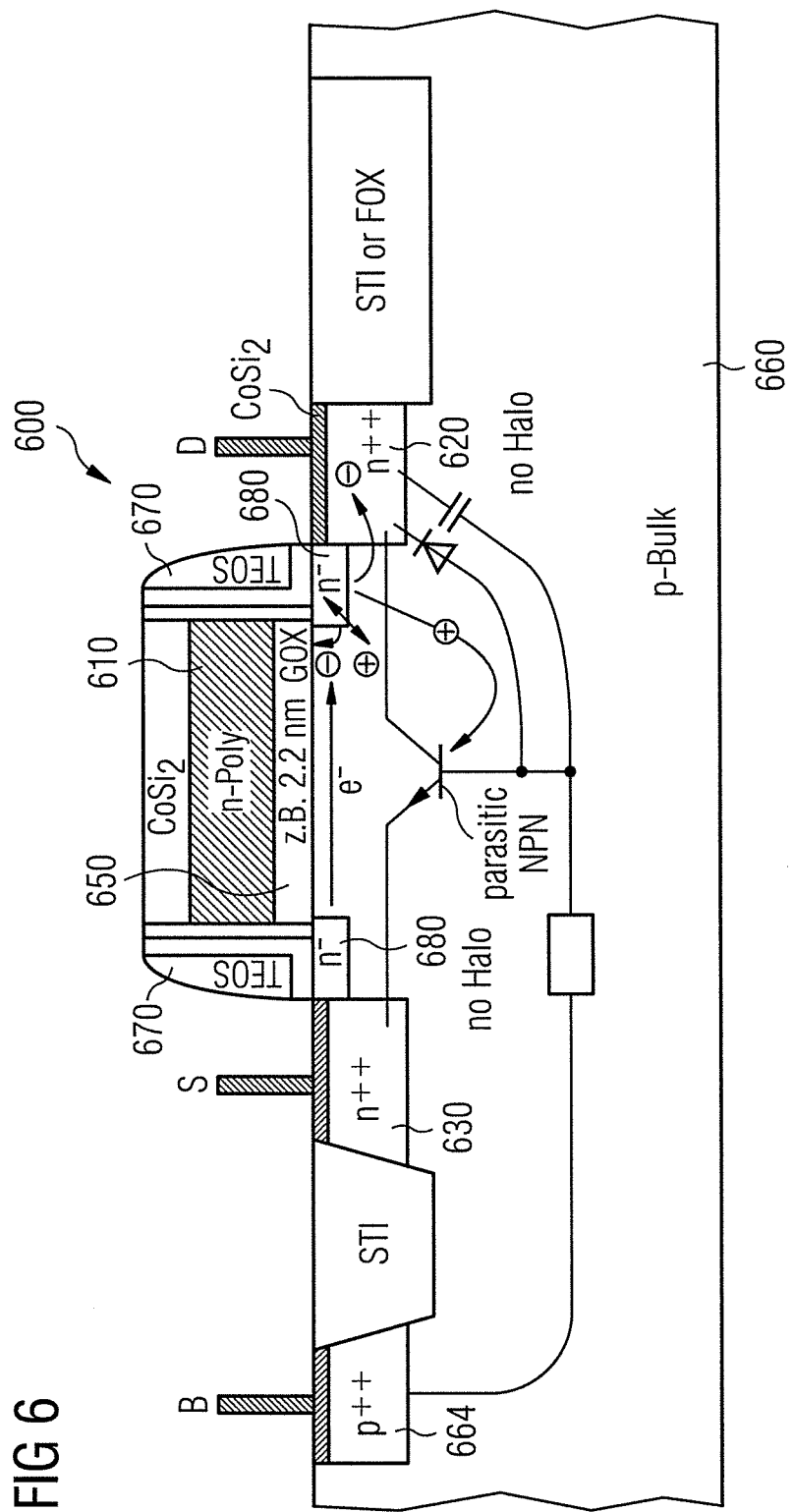
FIG. 6 shows a schematic cross-section of a one-time programming device.

FIG. 6 shows a schematic cross-section of a possible one-time programming device 600 indicating a parasitic NPN-bipolar transistor built up in an on-state of an n-channel MOS transistor. The transistor is manufactured on a p-bulk 660 and comprises a heavily n-doped drain region 620, a highly n-doped source region 630, a heavily p-doped bulk contact region 664 and a p-doped channel region. The gate oxide 650 between the channel region and the gate 610 comprises a thickness of 2.2 nm (as a possible example for some semiconductor technologies), for example. The gate 610 may comprise an n-polysilicon layer covered by a cobalt silicide (CoSi$_2$) layer. The gate oxide 650 and the gate 610 are bordered by multilayer, insulating spacers 670 (e.g., comprising TEOS, tetraethyl orthosilicate). Below the spacers 670, the source region 630 and the drain region 620 comprise lightly doped drain extensions (LDD, n−) 680. The drain region 620, the source region 630 and the bulk contact region 664 may be covered by cobalt silicide to allow a reliable ohmic contact (e.g., by a tungsten contact), for example. The source region 630 is spaced apart from the bulk contact region 664 by a shallow trench isolation (STI) and the drain region 620 is spaced apart from another active area by STI or FOX, for example.

Further, FIG. 6 indicates a parasitic NPN-bipolar transistor between the drain region 620, the source region 630 and the bulk contact region 664. In this example, the drain region 620 represents the collector, the source region 630 represents the emitter and the bulk contact area 664 represents the base of the bipolar transistor. By implementing a higher resistive connection to the bulk contact region 664, an increase of the current through this bipolar effect can be promoted. Positive charge carriers (holes) also indicated in FIG. 6 may establish a significant base current. Further, the diode between the base and the collector and the capacitance between the base and the collector are indicated in FIG. 6.

FIG. 6 may be an illustration of the OTP-MOS programming principle by damaging (alloying) the p-n junction between drain and bulk (or channel) by impact ionization, avalanche and/or thermal destruction.

As mentioned, several parameters can promote the strength of the influence of the bipolar transistor to the generation of the critical electrical field. For example, one parameter may be the resistance of the bulk connection. Therefore, optionally or additionally to one or more aspects mentioned above, a bulk connection of the field effect semiconductor transistor may be constructed so that in the on-state of the field effect semiconductor transistor a parasitic bipolar transistor established between the source region, the drain region and a bulk contact contributes with at least 10% (or at least 5%, at least 20%, at least 30%, at least 40% or at least 50%) to the overall drain current (sum of current through the drain contact) before the gate oxide or the p-n junction between the drain region and the channel region or the bulk region is damaged.

For example, this can be done by increasing the resistance between the channel region and the bulk contact compared to a standard field effect semiconductor transistor. In other words, the field effect semiconductor transistor of the one-time programming device and a standard field effect semiconductor transistor providing a stable transistor functionality (e.g., providing the functionality most likely until the forecast lifetime of the corresponding electrical circuit and for a huge number of switching cycles) may be manufactured on a common or same semiconductor die. In this connection, a bulk connection of the standard field effect semiconductor transistor and a bulk connection of the field effect semiconductor transistor of the one-time programming device may be constructed so that the standard field effect semiconductor transistor comprises at least a 10× (or 5×, 20×, 50×, 100× or more) at least lower minimal resistance to a bulk contact (e.g., the bulk contact closest to the MOS transistor) than the field effect semiconductor transistor of the one-time programming device. This may be implemented in various ways. For example, the bulk contact of the field effect semiconductor transistor (e.g., the closest bulk contact) may be located significantly farther away than the bulk contact of the standard field effect semiconductor transistor.

Alternatively, additionally or optionally, a bulk contact to the bulk of the field effect semiconductor transistor of the one-time programming device can be omitted at all so that a well, in which the field effect semiconductor transistor of the one-time programming device is located, is electrically floating (e.g., comprises an undefined electrical potential, which depends on the electrical potentials of the surrounding structures in an operating state). In other words, the field effect semiconductor transistor of the one-time programming device may be manufactured within a well (depending on the kind of transistor in a p or n well) so that a p-n junction is formed to the semiconductor surrounding the well. This well forms the bulk of the field effect semiconductor transistor and may be floating (without an ohmic contact to a defined electrical potential in an operating state of the one-time programming device), resulting in a large bulk resistance (e.g. at least 10× larger, 20× larger, 50× larger, 100× larger or more) compared to a well connected to a defined electrical potential.

Optionally, alternatively or additionally, also the lightly-doped drain implant and/or a halo implant can be left out for the field effect semiconductor transistor of the one-time programming device resulting in a promoted influence of the parasitic bipolar transistor. In other words, alternatively, optionally or additionally to the aspects described above, the field effect semiconductor transistor of the one-time programming device and a standard field effect semiconductor transistor providing a stable transistor functionality may be manufactured on a common or same semiconductor die and the standard field effect semiconductor transistor may comprise a lightly-doped drain implant between the heavily-doped drain region and the channel region, while the lightly-doped drain implant is left out for the field effect semiconductor transistor of the one-time programming device.

Further, optionally, additionally or alternatively to the aspects described above, the field effect semiconductor transistor of the one-time programming device and a standard field effect semiconductor transistor providing a stable transistor functionality may be manufactured on a common or same semiconductor die and the standard field effect semiconductor transistor may comprise a halo implant, while the halo implant is left out for the field effect semiconductor transistor of the one-time programming device.

Figure 5:
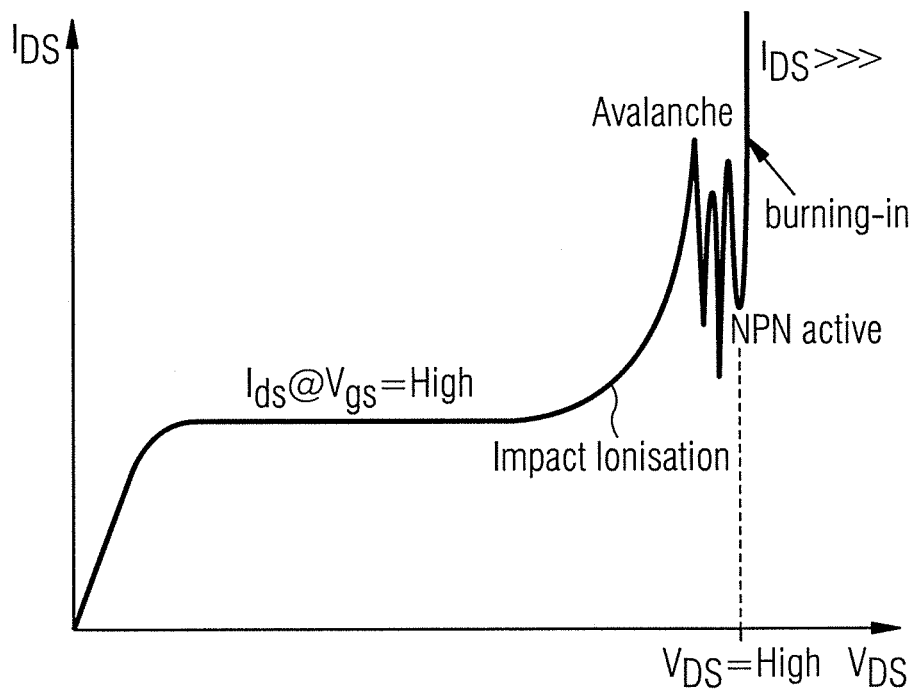
FIG. 5 shows a schematic diagram illustrating an electrical characteristic of a one-time programming device.

FIG. 5 shows an example of an electrical characteristic of a one-time programming device indicating an influence of an active parasitic NPN bipolar transistor. The diagram indicates the current between drain and source $I_{ds}$ during an increase of the voltage between drain and source $V_{ds}$ and the gate being on an electrical potential representing a digitally high level (although the one-time programming device may also be an analog device or may be used in an analog circuit) resulting in an on-state of the transistor. The characteristic indicates the beginning of an impact ionization in the channel region at a voltage of about two-thirds of the high level of the drain source voltage $V_{ds}$ and occurring avalanche promoted by the active parasitic NPN bipolar transistor resulting in a burning in and damage of the gate oxide or the p-n junction between the channel region or the bulk region and the drain region with a drain source current $I_{ds}$>>>significantly larger compared to a standard field effect semiconductor transistor.

FIG. 5 may show the OTP-MOS programming principle in terms of an output characteristic of an OTP-MOS with $V_{gs}$=V_high, $V_{ds}$=V_high and $I_{ds}$=high due to local avalanche occurrence.

As already mentioned, the programming of the one-time programming device can be implemented with voltages already available on a die due to the shaping of the footprint of the gate or the channel region. An additional charge pump for generating higher voltages for damaging the gate oxide of the p-n junction between the drain region and the channel region may not be necessary, for example. In other words, optionally, additionally or alternatively to one or more aspects mentioned above, the field effect semiconductor transistor of the one-time programming device and a standard field effect semiconductor transistor providing a stable transistor functionality may be manufactured on a common or same semiconductor die and the field effect semiconductor transistor of the one-time programming device may be constructed so that the critical electrical field is reachable or can be reached by using at the most (a maximum of) a maximal voltage difference available or used for operating the standard field effect semiconductor transistor as gate/source voltage and drain/source voltage of the field effect semiconductor transistor of the one-time programming device. In this way, additional efforts for implementing a supply voltage of the one-time programming device may be avoided.

A damage of the gate oxide or the p-n junction between the drain region and the channel region or the bulk region leads to increased cut-off currents or leakage currents at the drain. These currents may be sensed or measured by an analysis circuit to determine whether the one-time programming device is programmed or not. In other words, the one-time programming device may comprise an analysis circuit configured to sense a drain current of the field effect semiconductor transistor. Further, the analysis circuit may compare the sensed drain current to a reference threshold drain current (indicating a field effect semiconductor transistor with a faultless or undamaged gate oxide and p-n junction between the drain region and the channel region or the bulk region) so that an information of a state (e.g., programmed state or non-programmed state) of the one-time programming device can be obtained. In this way, the information stored by the one-time programming device can be easily read out.

Some embodiments relate to a one-time programming device comprising a field effect semiconductor transistor, which is constructed so that in an on-state of the field effect semiconductor transistor a critical electrical field is reached within an area of the channel region, the bulk region or the drain region of the field effect semiconductor transistor resulting in damage of a p-n junction between the channel region or the bulk region and the drain region of the field effect semiconductor transistor after a predefined programming time.

In this way, a one-time programming device can be implemented based on an alternative physical mechanism, namely the damaging of the p-n junction between the channel region or the bulk region and the drain region. In this way, a field effect semiconductor transistor structure manufacturable by a standard MOS manufacturing process can be used for manufacturing the one-time programming device.

The one-time programming device may comprise additional, optional features corresponding to one or more aspects of the described concept or one of the embodiments described above.

Figure 7:
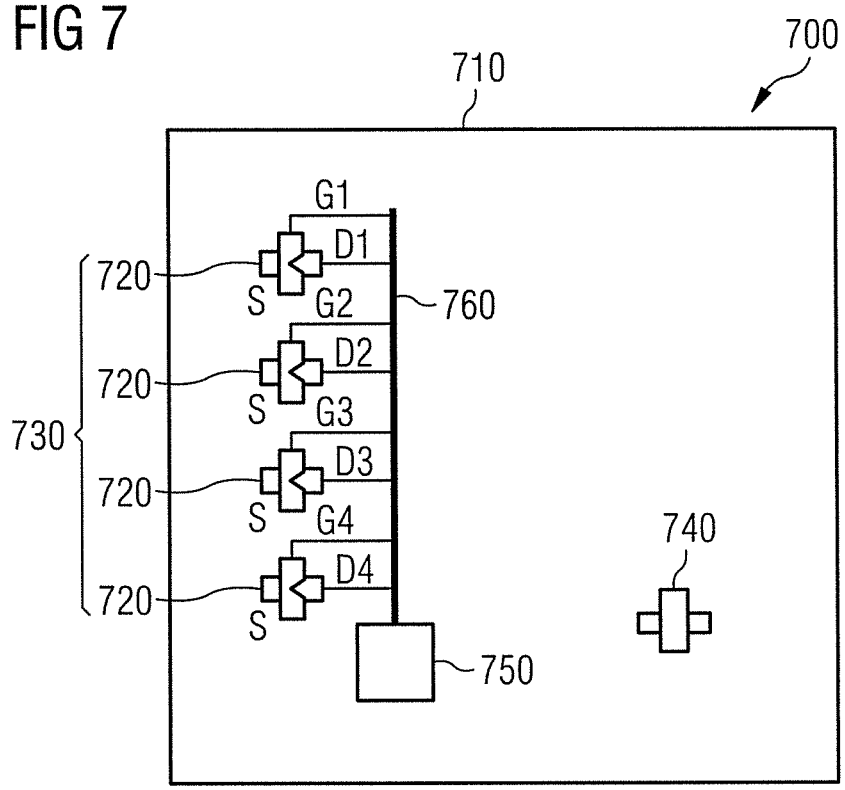
FIG. 7 shows a schematic top view of a semiconductor device.

FIG. 7 shows a schematic top view of a semiconductor device 700 according to an embodiment. The semiconductor device 700 comprises at least one standard field effect semiconductor transistor 740 (e.g., a metal oxide semiconductor transistor or another field effect transistor) providing a stable transistor functionality and an array 730 of one-time programming devices 720, each comprising a field effect semiconductor transistor manufactured on a common or same semiconductor die 710. The field effect semiconductor transistor of each one-time programming device 720 may comprise a source region comprising a first conductivity type (n or p doping), a drain region comprising the first conductivity type, a channel region and a gate. The channel region is located between the source region and the drain region and comprises a second conductivity type (p or n doping) so that the p-n junction is formed between the channel region and the source region and between the channel region and the drain region. Additionally, a bulk region of the field effect semiconductor transistor comprises the second conductivity type. Further, the gate is arranged on top of the channel region and is electrically insulated from the channel region by a gate oxide between the gate and the channel region. The gate of the field effect semiconductor transistor comprises a notch at an edge of the gate facing the drain resulting in a channel length of the field effect semiconductor transistor varying over a channel width of the field effect semiconductor transistor so that in an on-state of the field effect semiconductor transistor a critical electrical field is reached within an area of the channel region of the field effect semiconductor transistor resulting in damage of a p-n junction between the channel region or the bulk region and the drain region of the field effect semiconductor transistor or resulting in damage of the gate oxide of the field effect semiconductor transistor after a predefined programming time. Further, a bulk connection of the standard field effect semiconductor transistor and a bulk connection of the field effect semiconductor transistor of the one-time programming device 720 are constructed so that the standard field effect semiconductor transistor 740 comprises at least a 10× lower minimal resistance to a bulk contact than the field effect semiconductor transistor of the respective one-time programming device 720.

Further, optionally the semiconductor device may comprise an analysis circuit 750, configured to sense a drain current of the field effect semiconductor transistors of each one-time programming device 720 as already mentioned above.

Further, the semiconductor device 700 may comprise additional, optional features corresponding to one or more aspects of the described concept or one of the embodiments described above.

Some embodiments relate to a method for operating a one-time programming device constructed according to the concept of one of the embodiments described above. The method comprises a programming of the one-time programming device by moving the field effect semiconductor transistor in an on-state for the predefined programming time.

Further, the method may comprise additional, optional acts corresponding to one or more aspects of the described concept or one of the embodiments described above.

Figure 8:
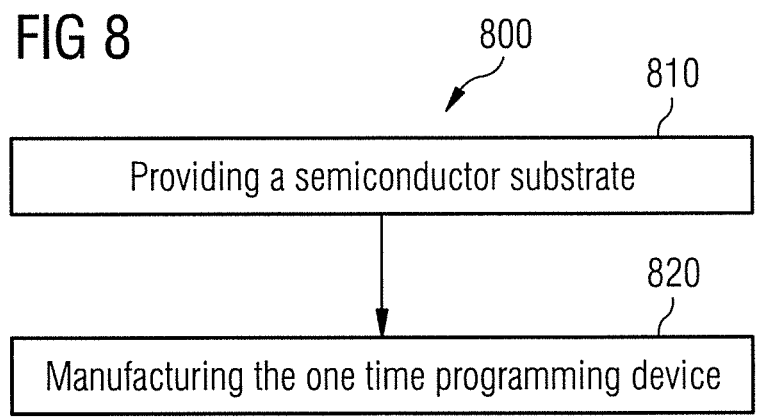
FIG. 8 shows a flowchart of a method for manufacturing a one-time programming device.

FIG. 8 shows a flowchart of a method 800 for manufacturing a one-time programming device according to an embodiment. The method 800 comprises providing a semiconductor substrate (e.g., a silicon substrate with base doping or a silicon substrate with an epitaxial layer on top) at 810 and manufacturing a one-time programming device according to the concept described above at 820.

The method 800 may comprise further additional, optional features corresponding to one or more aspects of the described concept or one of the embodiments described above.

Some embodiments according to the disclosure relate to a one-time programming device (OTP) being based on the physical mechanism of anti-fusing. In this connection, for example, not (only) an oxide break or diode zapping is used, but the drain-to-source/bulk distance of an MOS transistor (also called OTP-MOS) may be brought in a low ohmic state by a designed or built in impact ionization. Basically, a device structure based on an MOS transistor with drain D, gate G, source S and bulk B as electric connections may be used. This OTP-MOS-transistor may be not conductive (shut, $I_{ds}$=0 A or less than 1 pA, less than 1 fA or less than 1 nA, depending on the semiconductor technology used), in the not-programmed state (in the off-state at $V_{gs}$=0 V). In the programmed state (in the off-state at $V_{gs}$=0 V), the OTP-MOS-transistor may be low ohmic conductive (leaking, $I_{ds}$>0 A, >µA, >1 mA, depending on the chip technology or semiconductor technology used).

Some aspects of the physical background during programming the OTP are that the OTP-MOS-transistor is brought in its on-state (e.g., $V_{gs}$=$V_{vdd}$=$V_{vcc}$ with e.g., 5 V, 3.3 V, 2.5 V, 1.5 V, depending on the used chip technology or semiconductor technology, which digitally means that $V_{gs}$=high). Further, the drain contact of the OTP-MOS may be connected to a low ohmic $V_{vdd}$-supplied impulse source (e.g., switched current source) so that the OTP-MOS transistor moves from the Ron region ($V_{ds}$<<<) to the linear ($V_{ds}$>>>). The OTP-MOS works in this case at a high $V_{ds}$ and high $V_{gs}$ voltage, at which the safe operating area (SOA) is left, in order to reach destructive high drain currents $I_{ds}$ caused by the proposed OTP-MOS construction. In this operation mode a degradation or destruction is undesired for a standard MOS-transistor (in comparison to such a desired effect for the one-time programming device), so that the standard transistor uses a homogeneous channel structure, a special zone for avoiding impact ionization in the drain region (e.g., lightly-doped drain LDD, halo implant or drift path implementation) and/or a low ohmic bulk connection to avoid a parasitic bipolar effect, for example. At the OTP-MOS, the destruction is done by a high local power dissipation (P=V*I), which leads to an energy absorption during an impulse impact time with the consequence of a destructive temperature increase. This local destruction can have the consequence that the p-n junction between drain and bulk (or channel region) forms a conductive connection in the cutoff OTP-MOS-state (leaky or short).

The OTP-MOS transistor may comprise a specific construction (layout). The OTP-MOS transistor may differ from a standard MOS transistor by a modified shape of the drain region (e.g., caused by a modified shape of the footprint of the gate) as for example shown in FIGS. 1A, 2, 3 and 4. This modification may be done in order to consciously worsen the SOA behavior by designing an artificial drain current concentrator (a gate or a channel region with the proposed shape of the footprint) so that a provoked impact ionization center occurs.

A critical electrical field strength (in silicon about 30 V/µm) should be reached in the impact ionization center very fast by using application of typical drain supply voltages, which leads to an electron hole pair generation and an avalanche effect. In the following, a parasitic lateral bipolar transistor may be activated in the MOS-channel in order to cause an artificial increase of the drain current. Additionally, the concentration (dopant concentration) of the bulk zone may be decreased so that an improved activation of the parasitic bipolar transistor within the OTP-MOS-channel can be achieved to increase the destructive behavior.

The device structure may be based on a standard MOS-transistor. The proposed MOS transistor (OTP-MOS) may be used as an anti-fuse structure in order to burn in or store a non-volatile information (high/low=high ohmic/low ohmic) permanently, securely and highly reliably. The programming=anti-fusing=burning in may happen by a short switching on of the OTP-MOS with following damaging (alloying) of the drain-bulk junction by an extreme concentration of the drain current at a point of the p-n junction. The OTP-MOS transistor may be characterized by a drain region tapering from the contact connection in the direction of the channel (caused by a notched gate) so that a shape similar to a wedge (which may also be convex or concave) is built, which may lead to an extremely high local drain current density during the programming process after switching on the transistor. Electron hole pairs may be generated due to the high current concentration, which may lead to an avalanche effect by impact ionization and may generate damage of the drain-bulk-p-n junction due to the formation of a thermal hotspot subsequently. Consequently, the OTP-MOS transistor may not sufficiently cut off anymore after programming. During the readout of the information, the drain current value of the OTP-MOS-transistor in the off-state may be analyzed by an analysis circuit in order to determine whether the transistor is programmed or not. In this connection, a high drain current indicates a programming.

As already mentioned, FIGS. 1A, 2, 3 and 4 show examples for OTP-MOS structures to be operated as anti-fuse elements. For example, FIG. 2 may show an OTP-MOS, which also can be called notch-MOS, with a notch at the poly (polysilicon) gate for achieving a wedge-shaped drain tip.

Further, FIG. 3 shows an example for such a notch-MOS with a notch at the poly gate for achieving a wedge-shaped drain tip as well. Further, a point-shaped concentration of the electron current at the drain tip (hotspot due to impact ionization) can be seen.

As already mentioned, FIG. 4 shows an example of a curare-MOS with a notch at the poly gate for achieving a wedge-shaped drain tip. The electron current broadly provided by the source side is concentrated funnel-shaped in direction of the drain tip.

Another embodiment of an OTP-MOS can be based on an MOS-structure, which is constructed according to the resurf principle (reduced surface field strength) with a drift path, a so-called drain extension, for example. The drift path at the drain side may be constructed wedge-shaped in the direction of the channel. Further, the bulk zone arranged below may be implemented high ohmic in order to activate the parasitic bipolar transistor more easily.

Embodiments may further provide a computer program having a program code for performing one of the above methods, when the computer program is executed on a computer or processor. A person of skill in the art would readily recognize that steps of various above-described methods may be performed by programmed computers. Herein, some embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A one time programming device comprising a field effect semiconductor transistor, wherein a gate or a channel region of the field effect semiconductor transistor comprises a shape of a footprint so that in an on-state of the field effect semiconductor transistor a critical electrical field is reached within an area of the channel region, a bulk region or a drain region of the field effect semiconductor transistor due to the shape of the footprint resulting in a damage of a p-n-junction between the channel region or the bulk region and the drain region of the field effect semiconductor transistor or resulting in a damage of a gate insulation of the field effect semiconductor transistor after a predefined programming time,
   wherein the shape of the footprint of the gate comprises a notch at an edge of the gate facing the drain region resulting in a channel length of the field effect semiconductor transistor varying over a channel width of the field effect semiconductor transistor so that the critical electrical field is reached within an area of the channel region, the bulk region or the drain region close to an area of the notch constituting a minimal channel length, and
   wherein the notch is wedge shaped,
   wherein the notch comprises two sides meeting each other at an acute angle that comprises the area of the notch constituting the minimal channel length.

2. The one time programming device according to claim 1, wherein the wedge shaped notch causes a wedge-shaped drain tip.

3. The one time programming device according to claim 2, wherein the footprint of the gate defines an area of the gate located above the channel region, which is insulated from the channel region by the gate insulation, wherein the footprint of the gate comprises a basically rectangular or quadratic shape with exception of the notch at the edge of the gate facing the drain region.

4. The one time programming device according to claim 1, wherein the footprint of the channel region comprises a varying width resulting in a varying channel width, wherein the width of the channel region at an edge of the gate facing the source region is larger than a width of the area of the channel region or the bulk region reaching the critical electrical field.

5. The one time programming device according to claim 4, wherein the width of the channel region comprises a funnel-shaped taper that narrows from the edge of the gate facing the source region to the area of the channel region, the bulk region or the drain region reaching the critical electrical field.

6. The one time programming device according to claim 1, wherein the field effect semiconductor transistor is constructed so that an off-state drain current is at least 100 times higher after being in the on-state for at least the predefined programming time than before the predefined programming time.

7. The one time programming device according to claim 1, wherein the field effect semiconductor transistor comprises:
   a source region comprising a first conductivity type;
   the drain region comprising the first conductivity type;
   the channel region arranged between the source region and the drain region and a bulk region comprising a second conductivity type so that a p-n-junction is formed between the bulk region and the source region and between the bulk region and the drain region; and
   a gate arranged on top of the channel region, wherein the gate is electrically insulated from the channel region by a gate insulation between the gate and the channel region.

8. The one time programming device according to claim 7, wherein the field effect semiconductor transistor is manufactured within a well comprising the second conductivity type so that a p-n-junction is formed to a semiconductor surrounding the well, wherein the well forms the bulk region of the field effect semiconductor transistor, and wherein the well is electrically floating during the predefined programming time.

9. The one time programming device according to claim 1, wherein a bulk connection of the field effect semiconductor transistor is constructed so that in the on-state of the field effect semiconductor transistor a parasitic bipolar transistor established between a source region, the drain region and the bulk region therebetween contributes with at least 10% to the overall drain current before the gate insulation or the p-n-junction between the channel region or the bulk region and the drain region is damaged.

10. The one time programming device according to claim 1, wherein the field effect semiconductor transistor of the one time programming device and a standard field effect semiconductor transistor providing a stable transistor functionality are manufactured on a common semiconductor die, wherein the field effect semiconductor transistor of the one time programming device is constructed so that the critical electrical field is reachable by using at most a maximal voltage difference available for operating the standard field effect semiconductor transistor as gate/source voltage and drain/source voltage of the field effect semiconductor transistor of the one time programming device.

11. The one time programming device according to claim 1, wherein the field effect semiconductor transistor of the one time programming device and a standard field effect semiconductor transistor providing a stable transistor functionality are manufactured on a common semiconductor die, wherein the standard field effect semiconductor transistor comprises a lightly doped drain implant region between a heavily doped drain region and a channel region, and wherein a similar lightly doped drain implant is left out for the field effect semiconductor transistor of the one time programming device.

12. The one time programming device according to claim 1, wherein the field effect semiconductor transistor of the one time programming device and a standard field effect semiconductor transistor providing a stable transistor functionality are manufactured on a common semiconductor die, wherein the standard field effect semiconductor transistor comprises a halo implant region between the drain and the bulk region, and wherein a similar halo implant region is left out for the field effect semiconductor transistor of the one time programming device.

13. The one time programming device according to claim 1, wherein the field effect semiconductor transistor of the one time programming device and a standard field effect semiconductor transistor providing a stable transistor functionality are manufactured on a common semiconductor die, wherein a bulk connection of the standard field effect semiconductor transistor and a bulk connection of the field effect semiconductor transistor of the one time programming device are constructed so that the standard field effect semiconductor transistor comprises at least a 10 times lower resistance to a bulk contact than the field effect semiconductor transistor of the one time programming device before the gate insulation or the p-n-junction between the channel region or the bulk region and the drain region is damaged.

14. The one time programming device according to claim 1, further comprising an analysis circuit configured to sense a drain current of the field effect semiconductor transistor and to compare the sensed drain current to a reference threshold drain current so that an information on a state of the one time programming device is obtained based on a result of the comparison.

15. The one time programming device according to claim 1, wherein the critical electrical field is larger than 25 V/μm.

16. The one time programming device according to claim 1, wherein the predefined programming time is less than 10 s.

* * * * *